(12) United States Patent
Okabe

(10) Patent No.: US 8,236,125 B2
(45) Date of Patent: Aug. 7, 2012

(54) METHOD FOR MANUFACTURING THIN FILM MULTILAYER DEVICE, METHOD FOR MANUFACTURING DISPLAY DEVICE, AND THIN FILM MULTILAYER DEVICE

(75) Inventor: Tohru Okabe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 221 days.

(21) Appl. No.: 12/808,275

(22) PCT Filed: Sep. 25, 2008

(86) PCT No.: PCT/JP2008/002660
§ 371 (c)(1),
(2), (4) Date: Jun. 15, 2010

(87) PCT Pub. No.: WO2009/107171
PCT Pub. Date: Sep. 3, 2009

(65) Prior Publication Data
US 2010/0291391 A1     Nov. 18, 2010

(30) Foreign Application Priority Data

Feb. 28, 2008 (JP) .................................. 2008-047558

(51) Int. Cl.
*B29C 65/48* (2006.01)
*B29C 63/00* (2006.01)
*B32B 37/26* (2006.01)
*B32B 38/04* (2006.01)
*B32B 38/10* (2006.01)

(52) U.S. Cl. ........ 156/247; 156/248; 156/257; 156/718; 156/719

(58) Field of Classification Search .................. 156/247, 156/248, 250, 257, 289, 701, 717, 718, 719; 428/1.1, 1.23, 1.51, 1.61, 1.62
See application file for complete search history.

(56) References Cited

U.S. PATENT DOCUMENTS

| | | | | |
|---|---|---|---|---|
| 5,856,858 | A | * | 1/1999 | Carey et al. .................... 349/158 |
| 6,452,653 | B1 | * | 9/2002 | Yamanaka et al. ............. 349/113 |
| 6,521,511 | B1 | | 2/2003 | Inoue et al. |
| 6,650,380 | B2 | * | 11/2003 | Song ............................... 349/47 |

(Continued)

FOREIGN PATENT DOCUMENTS

JP    07-325297 A    12/1995

(Continued)

OTHER PUBLICATIONS

Official Communication issued in International Patent Application No. PCT/JP2008/002660, mailed on Dec. 22, 2008.

*Primary Examiner* — Sing P Chan
(74) *Attorney, Agent, or Firm* — Keating & Bennett, LLP

(57) ABSTRACT

A method for manufacturing a thin film multilayer device includes bonding a plastic substrate to a support substrate using an adhesive so that an upper film and a lower film constituting a weak adhesive inorganic film are sandwiched between the plastic substrate and the support substrate, and the plastic substrate is supported by the support substrate with an adhesive force stronger than an adhesive force between the upper and lower films, stacking a plurality of thin films on the plastic substrate supported by the support substrate, and separating the upper film from the lower film to separate the plastic substrate on which the plurality of thin films are stacked, from the support substrate.

10 Claims, 4 Drawing Sheets

U.S. PATENT DOCUMENTS

| | | | |
|---|---|---|---|
| 6,653,207 B2 * | 11/2003 | Ohya et al. | 438/458 |
| 6,943,369 B2 | 9/2005 | Hayashi | 257/40 |
| 6,982,181 B2 * | 1/2006 | Hideo | 438/30 |
| 7,019,813 B2 | 3/2006 | Shinada | 355/47 |
| 7,067,392 B2 | 6/2006 | Yamazaki et al. | 438/455 |
| 7,084,045 B2 | 8/2006 | Takayama et al. | 438/455 |
| 7,160,587 B2 | 1/2007 | Doi | 428/1.6 |
| 7,229,900 B2 * | 6/2007 | Takayama et al. | 438/458 |
| 7,279,239 B2 * | 10/2007 | Akedo et al. | 428/704 |
| 7,321,194 B2 * | 1/2008 | Kondo et al. | 313/504 |
| 7,335,573 B2 | 2/2008 | Takayama et al. | 438/455 |
| 7,341,924 B2 * | 3/2008 | Takayama et al. | 438/455 |
| 7,351,300 B2 | 4/2008 | Takayama et al. | 156/239 |
| 7,466,390 B2 * | 12/2008 | French et al. | 349/158 |
| 7,595,256 B2 | 9/2009 | Takayama et al. | 438/458 |
| 7,611,965 B2 * | 11/2009 | Suzuki et al. | 438/458 |
| 8,034,206 B2 * | 10/2011 | Kim et al. | 156/235 |
| 8,129,898 B2 * | 3/2012 | Choi et al. | 313/504 |
| 2003/0040164 A1 * | 2/2003 | Inoue et al. | 438/438 |
| 2003/0117561 A1 * | 6/2003 | Song | 349/149 |
| 2003/0162312 A1 * | 8/2003 | Takayama et al. | 438/22 |
| 2004/0053449 A1 * | 3/2004 | Chang et al. | 438/149 |
| 2004/0247949 A1 * | 12/2004 | Akedo et al. | 428/704 |
| 2006/0028133 A1 * | 2/2006 | Kondo et al. | 313/512 |
| 2006/0063351 A1 * | 3/2006 | Jain | 438/455 |
| 2008/0049437 A1 * | 2/2008 | Takayama et al. | 362/490 |
| 2009/0061223 A1 * | 3/2009 | Tsukahara et al. | 428/349 |
| 2009/0231477 A1 * | 9/2009 | Igarashi et al. | 348/294 |
| 2009/0278449 A1 * | 11/2009 | Choi et al. | 313/504 |
| 2010/0210055 A1 * | 8/2010 | Yoon et al. | 438/30 |
| 2010/0245751 A1 * | 9/2010 | Muneyoshi et al. | 349/149 |

FOREIGN PATENT DOCUMENTS

| | | |
|---|---|---|
| JP | 11-026733 A | 1/1999 |
| JP | 2000-248243 A | 9/2000 |
| JP | 2002-031818 A | 1/2002 |
| JP | 2003-229548 A | 8/2003 |

* cited by examiner

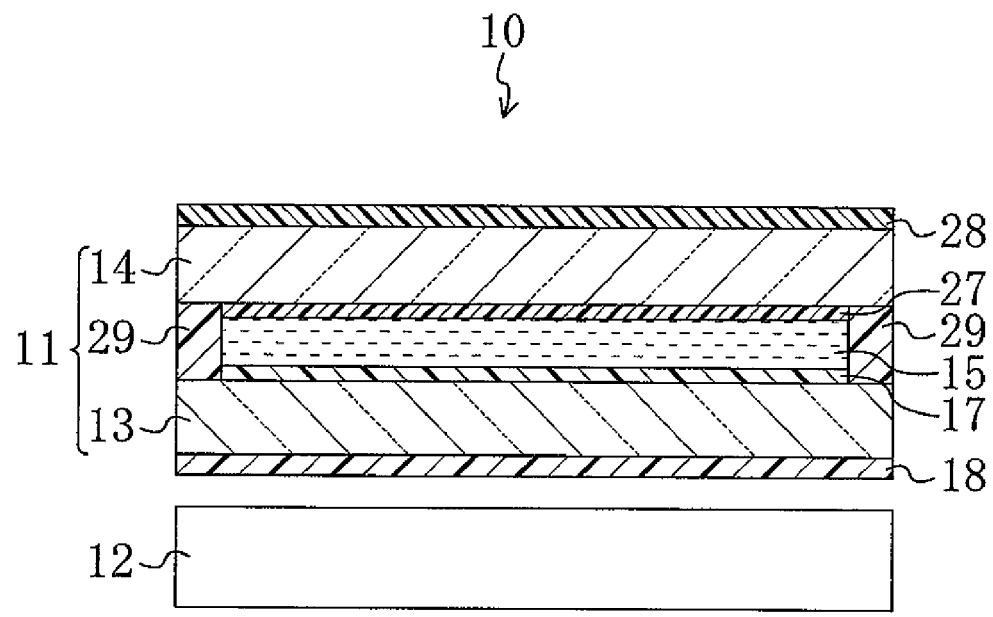
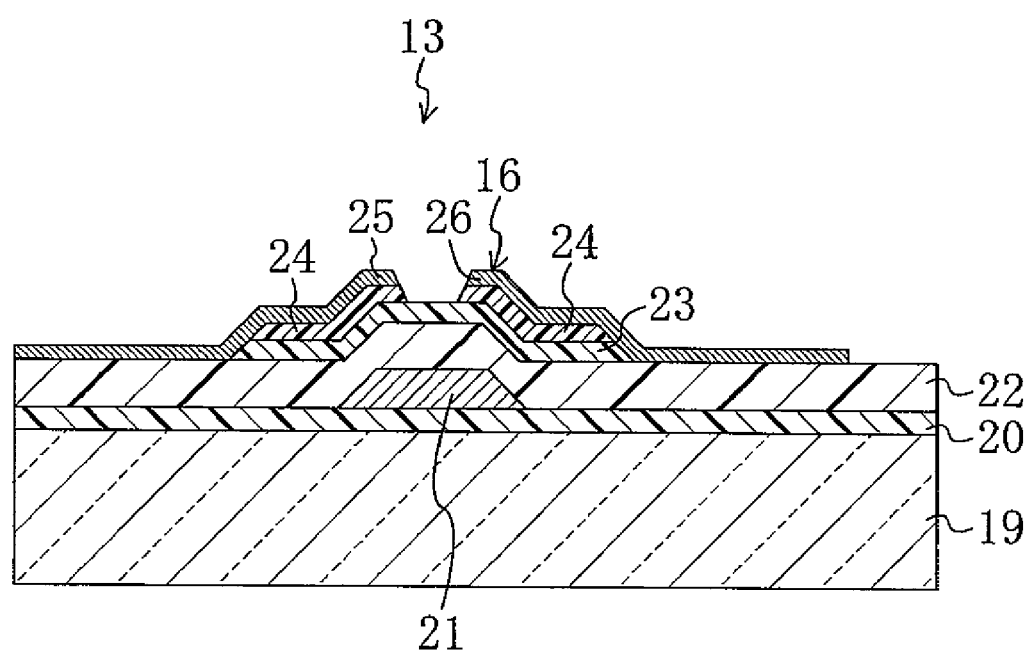

METHOD FOR MANUFACTURING THIN FILM MULTILAYER DEVICE, METHOD FOR MANUFACTURING DISPLAY DEVICE, AND THIN FILM MULTILAYER DEVICE

TECHNICAL FIELD

The present invention relates to methods for manufacturing thin film multilayer devices, methods for manufacturing display devices, and thin film multilayer devices.

BACKGROUND ART

Conventionally, attempts have been made to manufacture high-performance thin film devices, such as transistors, sensors, and the like, using a flexible substrate made of a plastic or metal thin film or the like, instead of a rigid substrate made of glass, silicon, or the like. In particular, plastic substrates having transparency and excellent durability have attracted much attention and have been expected to serve as substrates for next-generation displays. However, plastic substrates are thinner and easier to bend than glass substrates, and therefore, are considerably difficult to convey. This is a significant problem.

To address such a problem with plastic substrates, for example, Patent Document 1 describes a method of subjecting to processes, such as a photo step and the like, a complex substrate which is obtained by bonding a plastic substrate to a glass substrate which is a support substrate, using an adhesive whose adhesive force is reduced by ultraviolet light, and thereafter, separating the plastic substrate from the support substrate by irradiation with ultraviolet light through a back surface thereof. Also, Patent Document 2 describes a method of separating a plastic substrate from a support substrate by heating.

Citation List

Patent Documents

PATENT DOCUMENT 1: Japanese Patent Laid-Open Publication No. H07-325297

PATENT DOCUMENT 2: Japanese Patent Laid-Open Publication No. 2000-248243

SUMMARY OF THE INVENTION

Technical Problem

In the aforementioned methods, however, the adhesive force is reduced whenever ultraviolet light irradiation or heating is performed in the steps of processing the complex substrate, and therefore, there is, for example, a problem that the plastic substrate is delaminated from the support substrate during a process. This delamination occurs because the expansion of the plastic substrate or the adhesive material (organic material) due to heat or moisture absorption is significantly larger than that of the support substrate, such as a glass substrate made of an inorganic material or the like, and the expansion difference causes stress at an interface between the plastic substrate and the support substrate. In particular, when a high-performance thin film transistor (TFT) is manufactured, it is necessary to produce the films at a temperature of as high as 250° C., and repeatedly form the fine patterns by irradiation with ultraviolet light. However, heating and irradiation with ultraviolet light lead to a reduction in the adhesive force of the adhesive material. Therefore, there is a trade-off problem when the processes such as thin film formation and the like are performed on the plastic substrate while the plastic substrate is satisfactorily supported by the support substrate. It is thus considerably difficult to satisfactorily form a device on the plastic substrate. Moreover, adhesive materials whose adhesive force is reduced by ultraviolet light or heat are much more expensive than those which are tailored to have a high adhesiveness, resulting in a problem with the manufacturing cost.

The present invention has been made in view of the aforementioned problems. It is an object of the present invention to provide a method for manufacturing a thin film multilayer device and a method for manufacturing a display device which can satisfactorily form a thin film device on a plastic substrate with a satisfactory manufacturing cost.

Solution to the Problem

A method according to the present invention for manufacturing a thin film multilayer device including a plastic substrate and a plurality of thin films stacked on the plastic substrate, includes a first step of preparing a plastic substrate on which a first inorganic film and a second inorganic film are stacked in this stated order, a second step of bonding the plastic substrate to a support substrate using an adhesive so that the first and second inorganic films are sandwiched between the plastic substrate and the support substrate, and the plastic substrate is supported by the support substrate with an adhesive force stronger than an adhesive force between the first and second inorganic films, a third step of stacking a plurality of thin films on the plastic substrate supported by the support substrate, and a fourth step of separating the first inorganic film from the second inorganic film to separate the plastic substrate on which the plurality of thin films are stacked, from the support substrate.

With such a configuration, a plurality of thin films can be formed on the plastic substrate which is likely to warp or bend while the plastic substrate is firmly supported by the support substrate using an adhesive having a strong adhesive force. As a result, even in the manufacture of the thin film multilayer device including repetition of steps, such as high-temperature heating, wet processing, and the like, the manufacture process can be satisfactorily performed without the plastic substrate being delaminated from the support substrate.

Moreover, after the plurality of thin films are formed on the plastic substrate, the plastic substrate is separated from the support substrate by separating the first and second inorganic films which are bonded to each other with a weaker adhesive force, from each other, rather than the plastic substrate being directly separated from the support substrate to which the plastic substrate is firmly attached. Therefore, an expensive adhesive material whose adhesive performance is reduced by irradiation with ultraviolet light or heating is not required, and a processing apparatus for irradiation with ultraviolet light or heating is not required. Therefore, the plastic substrate can be separated from the support substrate with a satisfactory processing efficiency and processing cost.

ADVANTAGES OF THE INVENTION

According to the present invention, a satisfactory thin film device can be formed on a plastic substrate with a satisfactory manufacturing cost.

BRIEF DESCRIPTION OF THE DRAWINGS

FIG. 1 is a cross-sectional view of a liquid crystal display device.

FIG. 2 is a cross-sectional view of an active matrix substrate.

DESCRIPTION OF REFERENCE CHARACTERS

Figure 3:
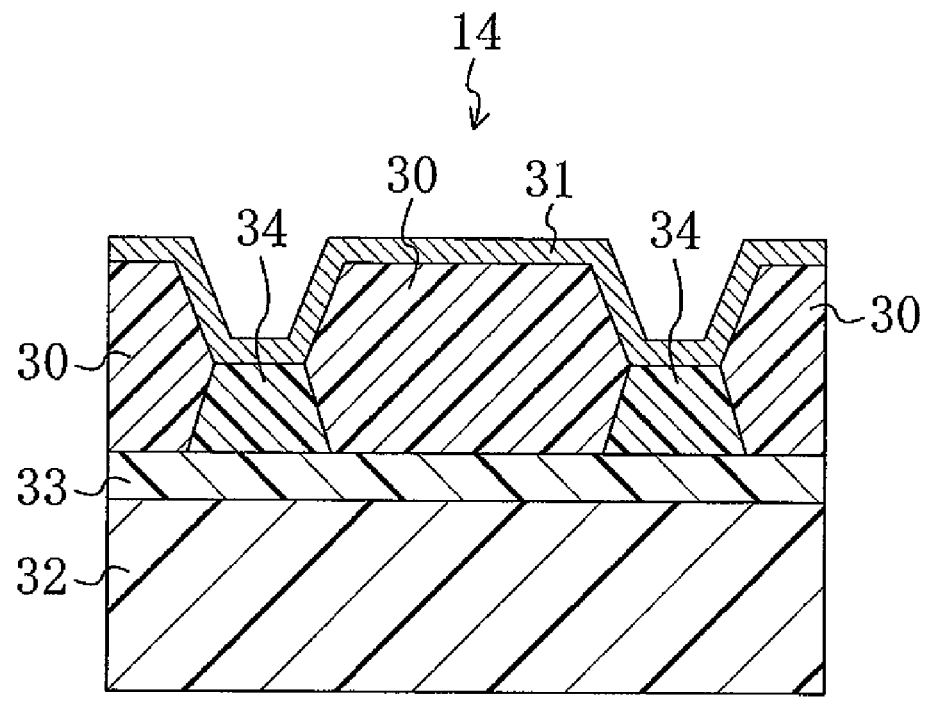
FIG. 3 is a cross-sectional view of a counter substrate.

| | |
|---|---|
| 10 | Liquid Crystal Display Device |
| 13 | Active Matrix Substrate |
| 14 | Counter Substrate |
| 16 | TFT |
| 19, 32 | Plastic Substrate |
| 41 | SiNx Film (First Inorganic Film) |
| 42 | Amorphous Silicon Film (Second Inorganic Film) |
| 43 | ITO Film (Third Inorganic Film) |
| 44 | Glass Substrate (Support Substrate) |
| 45 | Adhesive |
| 50 | Laser Light |
| 51 | Cut Surface |

DESCRIPTION OF EMBODIMENTS

A method for manufacturing a thin film multilayer device and a method for manufacturing a display device according to an embodiment of the present invention will be described hereinafter with reference to the accompanying drawings. Note that the present invention is not limited to the embodiment below. In this embodiment, a liquid crystal display device will be described as an example of the display device.

(Configuration of Liquid Crystal Display Device 10)

FIG. 1 is a cross-sectional view of a liquid crystal display device 10 according to an embodiment of the present invention. The liquid crystal display device 10 includes a liquid crystal display panel 11 and a backlight 12.

The liquid crystal display device 10 includes an active matrix substrate 13 and a counter substrate 14 each of which includes a plastic substrate and a thin film multilayer device including a plurality of thin films stacked on the plastic substrate. The liquid crystal display device 10 includes a liquid crystal layer 15 which is formed between the active matrix substrate 13 and the counter substrate 14.

FIG. 2 is a cross-sectional view of the active matrix substrate 13. A plurality of pixels (not shown) are provided on the active matrix substrate 13. For each pixel, a thin film transistor (TFT 16) is formed. An alignment film 17 is provided on a surface closer to the liquid crystal layer 15 of the active matrix substrate 13, while a polarizing plate 18 is provided on a surface farther from the liquid crystal layer 15 of the active matrix substrate 13.

The active matrix substrate 13 includes a plastic substrate 19 having a thickness of, for example, 0.1 mm. The plastic substrate 19 is formed of, for example, at least one of epoxy resins, PET resins, PES resins, polyimide resins, polyesters, polycarbonates, acrylic resins, and the like. The plastic substrate 19 may be any flexible substrate, and may be a complex plastic substrate including a glass component or the like. On one surface of the plastic substrate 19, a SiNx film 20 having a thickness of, for example, 150 nm is formed as a base coat, for example. A gate electrode 21 made of, for example, Ti or the like having a thickness of about 200 nm is formed in a portion of the SiNx film 20 for each pixel (not shown). A gate insulating film 22 formed of, for example, a SiNx layer or the like having a thickness of about 400 nm is formed to cover the SiNx film 20 and the gate electrode 21.

On the gate insulating film 22, a semiconductor layer 23 having a thickness of, for example, about 150 nm is formed to cover the entire gate electrode 21 with the gate insulating film 22 being interposed therebetween. The semiconductor layer 23 is formed of, for example, at least one of amorphous Si (a-Si), polycrystalline Si, microcrystalline Si, oxide semiconductors, and the like.

An n+ semiconductor layer 24 having a thickness of, for example, about 50 nm which is doped with a high concentration of an n-type impurity is formed on the semiconductor layer 23. A source electrode 25 and a drain electrode 26 each made of, for example, Ti or the like having a thickness of about 200 nm are formed on the n+ semiconductor layer 24 and the gate insulating film 22. Thus, the TFT 16 having the gate electrode 21, the source electrode 25, and the drain electrode 26 is formed on the active matrix substrate 13.

The TFT 16 is covered with a protective film (not shown) formed of, for example, a SiNx layer or the like. Moreover, a pixel electrode (not shown) constituting each pixel is formed on the drain electrode 26, and is electrically connected to the drain electrode 26.

As shown in FIG. 3, the counter substrate 14 includes a plastic substrate 32. A SiNx film 33 having a thickness of about 150 nm is formed as a base coat on the plastic substrate 32, for example. A plurality of color filter layers 30 constituting the respective pixels are formed at predetermined intervals on the SiNx film 33. A black matrix layer 34 is formed between adjacent color filter layers 30, separating the color filter layers 30 from each other. A counter electrode 31 is formed to cover the color filter layers 30 and the black matrix layers 34. An alignment film 27 is provided on a surface closer to the liquid crystal layer 15 of the counter substrate 14, while a polarizing plate 28 is provided on a surface farther from the liquid crystal layer 15 of the counter substrate 14.

The liquid crystal layer 15 is enclosed with a sealing member 29 which is formed between the active matrix substrate 13 and the counter substrate 14. Moreover, columnar spacers (not shown) made of, for example, plastic, glass, or the like are formed between the active matrix substrate 13 and the counter substrate 14 so as to provide a uniform gap between the two substrates 13 and 14.

(Method for Manufacturing Liquid Crystal Display Device 10)

Next, a method for manufacturing the liquid crystal display device 10 of the embodiment of the present invention will be described in detail with reference to the drawings.

(Step of Forming Active Matrix Substrate)

Figure 4:
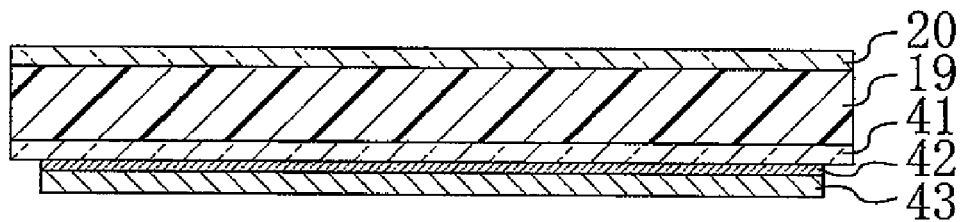
FIG. 4 is a cross-sectional view of a plastic substrate on which a SiNx film, an amorphous silicon film, and an ITO film are stacked in this stated order.

Initially, as shown in FIG. 4, the plastic substrate 19 having a size of, for example, about 320×420 mm and a thickness of, for example, about 0.1 mm is prepared. Next, the SiNx film 20 and a SiNx film 41 are formed on the respective surfaces facing each other of the plastic substrate 19 by a sputtering process or the like. The SiNx films 20 and 41 each have a thickness of, for example, about 1000 Å.

The SiNx film 20 formed in this case functions as a base coat which is a transparent insulating film having a low moisture permeability. The SiNx film 41 functions not only as a base coat as does the SiNx film 20, but also as an upper film (first inorganic film) of a weak adhesive inorganic film described below.

Next, an amorphous silicon film 42 is formed, by a CVD process or the like, in an inner region of the SiNx film 41 located a width of 10 mm or less away from a circumferential end of the SiNx film 41, i.e., leaving a space (exposed portion) having a width of 10 mm or less between the circumferential ends of the two films 41 and 42. The amorphous silicon film 42 has a thickness of, for example, about 200 Å. The amorphous silicon film 42 functions as a lower film (second inorganic film) of the weak adhesive inorganic film described below.

Next, an indium tin oxide (ITO) film 43, which is a transparent thin film, is formed on the amorphous silicon film 42 by a sputtering process or the like. The ITO film 43 has a thickness of, for example, about 1000 Å.

Here, the present inventor studied the adhesiveness between the inorganic films formed on the plastic substrate 19 to obtain the results shown in Table 1.

TABLE 1

| Upper Layer of Weak Adhesive Film (First Inorganic Film) | Lower Layer 1 of Weak Adhesive Film (Second Inorganic Film) | Lower Layer 2 of Weak Adhesive Film (Third Inorganic Film) | Weak Adhesive Force |
|---|---|---|---|
| SiNx | a-Si (200 Å) | — | X |
| SiNx | a-Si (5000 Å) | — | ○ |
| SiNx | a-Si (10000 Å) | — | ○ |
| SiNx | a-Si (200 Å) | ITO (1000 Å) | ○ |

The amorphous silicon film 42 has a strong film stress, and a small adhesive force with respect to inorganic films. Therefore, it was clear that the amorphous silicon film 42 having a thickness of 5000 Å or more would exhibit a sufficient weak adhesiveness when the amorphous silicon film 42 was used singly. According to Table 1, it was found that, by stacking the ITO film 43 on the amorphous silicon film 42, the thickness of the amorphous silicon film 42 was able to be reduced to 200 Å or less while the weak adhesiveness was maintained. When the thickness of the amorphous silicon film 42 is reduced to 200 Å or less, a state of a front surface of the substrate can be observed from a back surface of the substrate, and in addition, a so-called back surface exposure, i.e., patterning by exposure with ultraviolet light through the back surface of the substrate, can be employed. Therefore, various patterning processes can be performed on the plastic substrate 19 having a large substrate dimension change with high accuracy.

Figure 5:
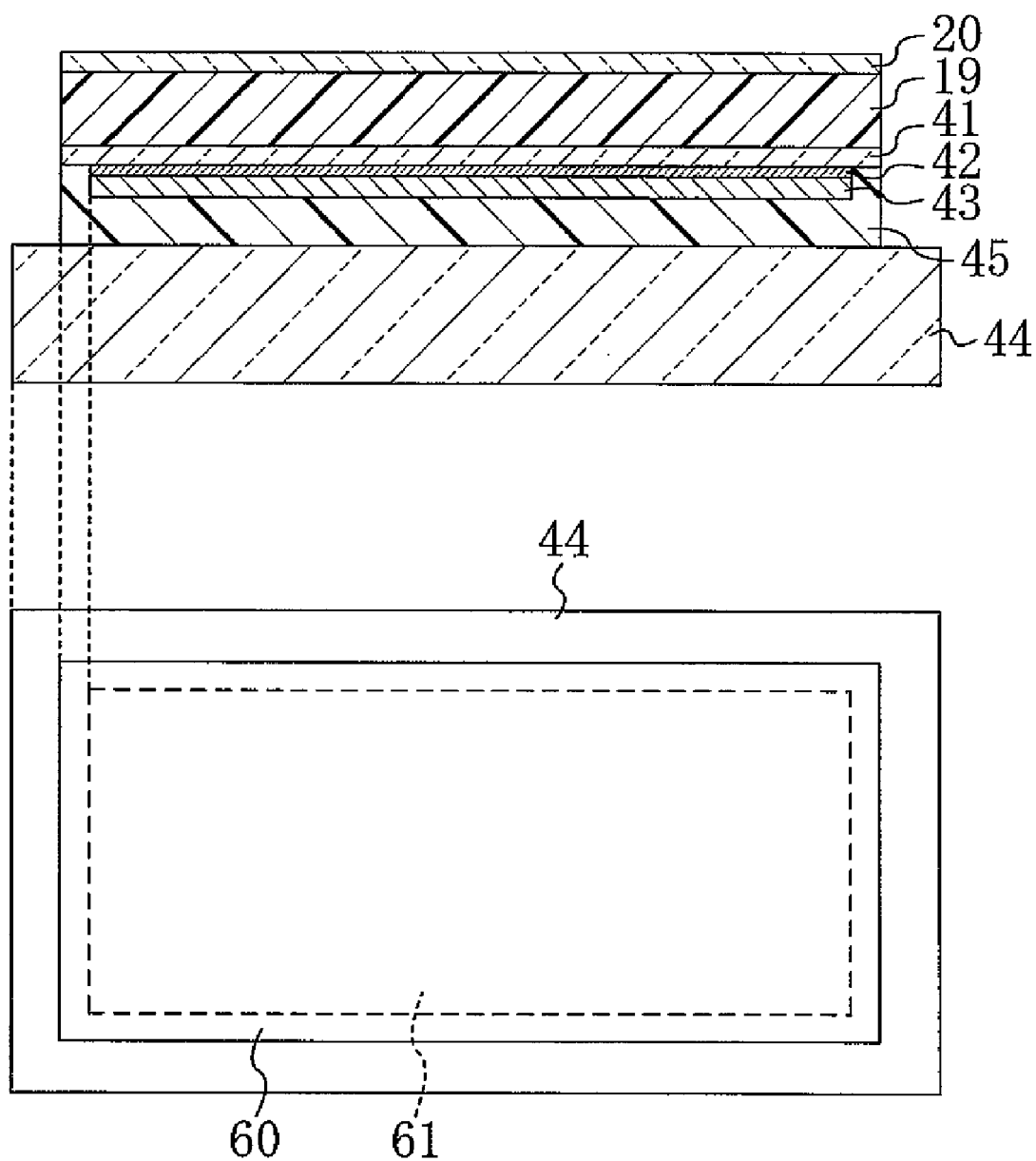
FIG. 5 is a cross-sectional view of a plastic substrate supported by a glass substrate and a plan view corresponding thereto.

Next, as shown in a cross-sectional view of the plastic substrate 19 shown in FIG. 5 (the upper figure of FIG. 5), a glass substrate 44 (support substrate) is prepared. Next, the plastic substrate 19 is bonded to the glass substrate 44 using an adhesive 45 so that the SiNx film 41 and the amorphous silicon film 42 are sandwiched between the plastic substrate 19 and the glass substrate 44, whereby the plastic substrate 19 is supported by the glass substrate 44. In this case, the adhesive 45 covers the exposed portion of the surface of the SiNx film 41 which has a width of 10 mm or less at the circumferential end of the surface of the SiNx film 41, and the ITO film 43 stacked on the amorphous silicon film 42. The adhesive 45, which is made of an inexpensive material which provides a sufficient adhesive strength even in a wet step using, for example, heating at 250° C. or more or a chemical solution, strongly bonds the plastic substrate 19 to the glass substrate 44. Examples of the adhesive include resin adhesives, such as epoxy adhesives, silicone adhesives, cyanoacrylate adhesives, and the like.

Although, in this embodiment, the plastic substrate 19 is bonded to the glass substrate 44 using the adhesive 45, a process of bonding the plastic substrate 19 to the glass substrate 44 is not limited to this. For example, a surface of one of the plastic substrate 19 and the glass substrate 44 may be roughened by a plasma treatment before the two substrates 19 and 44 may be bonded to each other by pressing the roughened surface against the other substrate.

Thus, as shown in a plan view of the plastic substrate 19 shown in FIG. 5 (the lower figure of FIG. 5), a strong adhesive region 60 corresponding to the exposed region having a width of 10 mm or less at the circumferential end of the SiNx film 41, and a weak adhesive region 61 corresponding to an interface region between the SiNx film 41 and the amorphous silicon film 42, which is surrounded by the strong adhesive region 60, are provided on a surface of the SiNx film 41 between the plastic substrate 19 and the glass substrate 44.

The adhesive force between the plastic substrate 19 and the glass substrate 44 is stronger than the adhesive force between the SiNx film 41 which is the upper film of the weak adhesive inorganic film and the amorphous silicon film 42 which is the lower film of the weak adhesive inorganic film.

Figure 6:
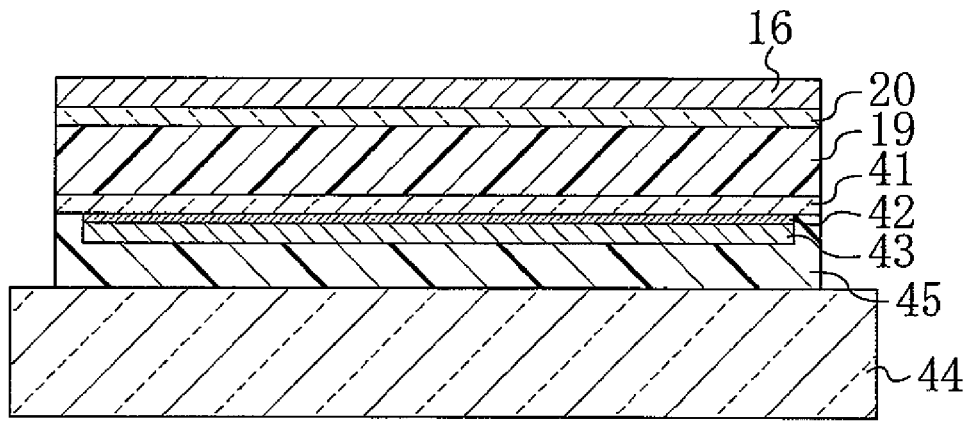
FIG. 6 is a cross-sectional view of a plastic substrate on which TFTs are formed while the plastic substrate is supported by a glass substrate.

Next, as shown in FIG. 6, a Ti film having a thickness of, for example, about 200 nm is formed on the plastic substrate 19 supported by the glass substrate 44 by a sputtering process before being patterned by a photolithography process, to form the gate electrodes 21. Next, a SiN film (400 nm), an a-Si film (150 nm), and an n+ Si film (50 nm) are successively formed as the gate insulating film 22, the semiconductor layer 23, and the n+ semiconductor layer 24, respectively, by a CVD process at a temperature of as high as 250° C. Next, the a-Si and n+ Si films are patterned by a photolithography process. Thereafter, a Ti film having a thickness of about 200 nm is formed by a sputtering process before being patterned by a photolithography process, to form the source electrodes 25 and the drain electrodes 26. Next, n+ Si is removed from a channel portion of each TFT 16 by a dry etching process to form the TFTs 16 on the plastic substrate 19. Because the plastic substrate 19 is bonded to the glass substrate 44, the thin films can be formed using an apparatus similar to those used for glass substrates.

Figure 7:
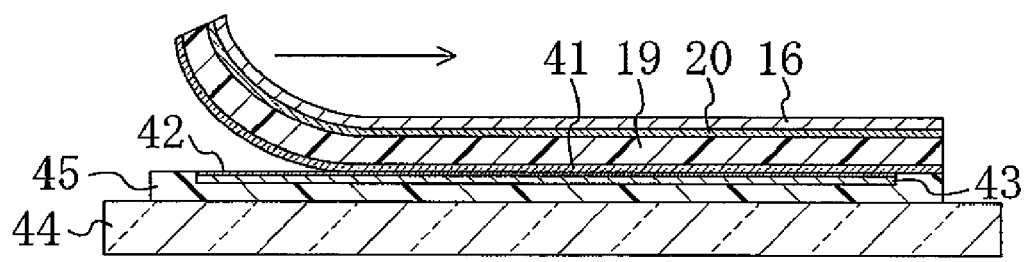
FIG. 7 is a cross-sectional view of a plastic substrate, where a SiNx film is separated from an amorphous silicon film.

Next, as shown in FIG. 7, the SiNx film 41 which is the upper film of the weak adhesive inorganic film and the amorphous silicon film 42 which is the lower film of the weak adhesive inorganic film are separated from each other, to separate the plastic substrate 19 on which the TFTs 16 and the like are formed from the glass substrate 44.

In this case, the exposed portion of the surface of the SiNx film 41 having a width of 10 mm or less at the circumferential end of the SiNx film 41 is firmly attached to the glass substrate 44 via the adhesive 45. Therefore, the SiNx film 41 which is the upper film of the weak adhesive inorganic film and the amorphous silicon film 42 which is the lower film of the weak adhesive inorganic film may be separated from each other using a stronger force in the exposed portion, and using a weaker force in the other portions. Therefore, the plastic substrate 19 can be easily separated from the glass substrate 44 while destruction of the plastic substrate 19 and the thin film multilayer device can be satisfactorily reduced or prevented. Next, the separated plastic substrate 19 is subjected to a predetermined treatment to produce the active matrix substrate 13.

Figure 8:
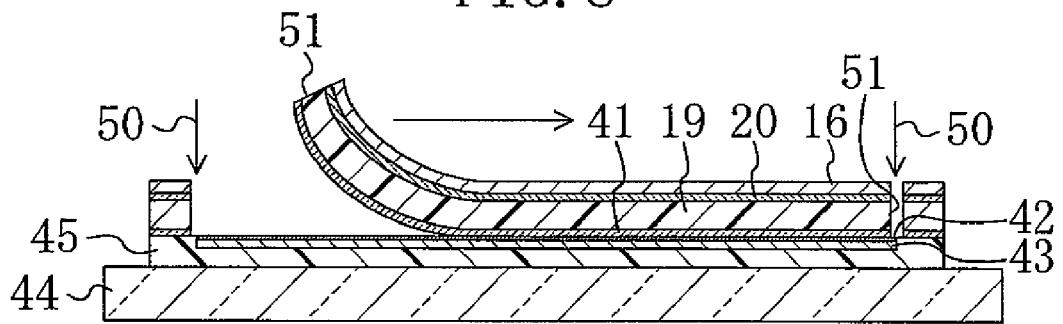
FIG. 8 is a cross-sectional view of a plastic substrate, where a SiNx film farther inside than a cut surface is separated from an amorphous silicon film.

Note that the plastic substrate 19 can be more easily separated by means of irradiation with laser light. Specifically, as shown in FIG. 8, a cut surface 51 extending in a thickness direction of the plastic substrate 19 and the SiNx film 41 is formed along portions of the plastic substrate 19 and the SiNx film 41 corresponding to the circumferential end of the amorphous silicon film 42, or along portions farther inside than those portions, by, for example, irradiation with laser light 50. Next, the plastic substrate 19 and the SiNx film 41 farther inside than the cut surface 51 are separated from the amorphous silicon film 42, to separate the plastic substrate 19 from the glass substrate 44.

Thus, by forming the cut surface 51 before separation, a portion farther outside than the cut surface 51, which is firmly attached via the adhesive 45, no longer has to be separated. Therefore, the plastic substrate 19 can be more easily separated from the glass substrate 44.

(Step of Forming Counter Substrate)

Next, a step of forming the counter substrate will be described. Initially, as in the active matrix substrate forming step, the plastic substrate 32 is prepared, and an upper film and a lower film constituting a weak adhesive inorganic film are formed. In this case, the lower film of the weak adhesive inorganic film is formed on an inner portion of the upper film of the weak adhesive inorganic film located a width of, for example, 10 mm or less away a circumferential end of the upper film, i.e., leaving a space having a width of, for example, 10 mm or less between circumferential ends of the lower and upper films.

Moreover, a transparent inorganic film which is an ITO film or the like is formed on the lower film of the weak adhesive inorganic film. The plastic substrate 32 is bonded to a glass substrate which is a support substrate, using an adhesive having a strong adhesive force, so that the transparent inorganic film which is an ITO film or the like is sandwiched between the plastic substrate 32 and the glass substrate.

Next, thin films which are the color filter layers 30, the counter electrode 31, and the like are formed on the plastic substrate 32 supported by the glass substrate before the counter substrate 14 is separated from the glass substrate. Also in this case, as in the active matrix substrate forming step, the exposed portion of the upper film surface of the weak adhesive inorganic film having a width of 10 mm or less at the circumferential end of the upper film of the weak adhesive inorganic film is firmly attached to the glass substrate via the adhesive. Therefore, the upper and lower films of the weak adhesive inorganic film may be separated from each other using a stronger force in the exposed portion and using a weaker force in the other portions. Therefore, the plastic substrate 32 can be easily separated from the glass substrate while destruction of the plastic substrate 32 and the thin film multilayer device is satisfactorily reduced or prevented. Next, the separated plastic substrate 32 is subjected to a predetermined treatment to produce the counter substrate 14.

Note that, as in the active matrix substrate forming step, a cut surface may be formed in the plastic substrate 32 and the like by, for example, irradiation with laser light before the plastic substrate 32 is separated from the glass substrate.

(Step of Bonding Substrates)

Next, the active matrix substrate 13 and the counter substrate 14 produced as described above are bonded to each other. Initially, the sealing member 29 is formed in the shape of substantially a frame in a frame region on a surface of the active matrix substrate 13 or the counter substrate 14 on which the alignment film 17 or 27 is formed. In this case, the sealing member 29 is formed so that an injection opening for injecting a liquid crystal material will be formed when the active matrix substrate 13 and the counter substrate 14 are bonded to each other. Thereafter, the active matrix substrate 13 and the counter substrate 14 are bonded to each other via the sealing member 29 so that surfaces thereof on which the alignment films 17 and 27 are respectively formed face each other. A liquid crystal material is injected through the injection opening before the injection opening is sealed. Thus, the liquid crystal layer 15 is formed.

Next, the polarizing plates 18 and 28 are attached to the surfaces farther from the liquid crystal layer 15 of the active matrix substrate 13 and the counter substrate 14, respectively, to produce the liquid crystal display panel 11. The backlight 12 is provided to the liquid crystal display panel 11. Thus, the liquid crystal display device 10 is completely manufactured.

Although the support substrate has been assumed to be the glass substrate 44 in the aforementioned embodiment, the present invention is not limited to this. The support substrate may be a metal substrate, a ceramic substrate, a resin substrate, or the like.

Moreover, although the active matrix substrate 13 and the counter substrate 14 of the liquid crystal display device 10 have been assumed to include the plastic substrates 19 and 32, respectively, the present invention is not limited to this. At least one of the active matrix substrate 13 and the counter substrate 14 may include a plastic substrate.

Moreover, although the gate electrode 21, the source electrode 25, and the drain electrode 26 have been assumed to be made of Ti, the present invention is not limited to this. For example, the gate electrode 21, the source electrode 25, and the drain electrode 26 may be made of Al, Mo, MoW, MoNb, an Al alloy, Ta, ITO, or the like.

Moreover, although the cut surface 51 of the plastic substrate 19 has been assumed to be formed by irradiation with the laser light 50, the present invention is not limited to this. For example, the cut surface 51 may be formed using a dicing apparatus or the like.

Moreover, although a liquid crystal display device has been illustrated as the display device in this embodiment, the present invention is not limited to this. For example, the display device may be an electroluminescent display device, a plasma display device, an electrochromic display device, a field emission display, or the like.

Moreover, although the SiNx film 41 has been used as the upper film of the weak adhesive inorganic film, any film may be used as long as it functions as the base coat and the upper film of the weak adhesive inorganic film.

Moreover, although the amorphous silicon film 42 has been used as the lower film of the weak adhesive inorganic film, any inorganic film may be used as long as the adhesive force between it and the upper film of the weak adhesive inorganic film is smaller than that of the adhesive 45.

(Operation and Advantages)

Next, operation and advantages of the embodiment of the present invention will be described.

The method for manufacturing the thin film multilayer device of this embodiment includes the step of bonding the plastic substrate 19 to the glass substrate 44 via the adhesive 45 so that the SiNx film 41 which is the upper film of the weak adhesive inorganic film and the amorphous silicon film 42 which is the lower film of the weak adhesive inorganic film are sandwiched between the plastic substrate 19 and the glass substrate 44, whereby the plastic substrate 19 is supported by the glass substrate 44 with an adhesive force stronger than an adhesive force between the SiNx film 41 and the amorphous silicon film 42. The method further includes the step of stacking a plurality of thin films on the plastic substrate 19 supported by the glass substrate 44. The method further includes the step of separating the SiNx film 41 from the amorphous silicon film 42 to separate the plastic substrate 19 on which the plurality of thin films are stacked from the glass substrate 44.

With such a configuration, a plurality of thin films can be formed on the plastic substrate 19 which is likely to warp or bend while the plastic substrate 19 is firmly supported by the glass substrate 44 using the adhesive 45 having a strong adhesive force. As a result, even in the manufacture of a thin film multilayer device including repetition of steps, such as high-temperature heating, wet processing, and the like, the manufacture process can be satisfactorily performed without the plastic substrate 19 being delaminated from the glass substrate 44.

Moreover, after a plurality of thin films are formed on the plastic substrate 19, the plastic substrate 19 is separated from the glass substrate 44 by separating the SiNx film 41 and the amorphous silicon film 42 which are bonded to each other with a weaker adhesive force, from each other, rather than the plastic substrate 19 being directly separated from the glass substrate 44 to which the plastic substrate 19 is firmly attached. Therefore, an expensive adhesive material whose adhesive performance is reduced by irradiation with ultraviolet light or heating is not required, and a processing apparatus for irradiation with ultraviolet light or heating is not required. Therefore, the plastic substrate 19 can be separated from the glass substrate 44 with a satisfactory processing efficiency and processing cost.

Here, the delamination of conventional substrates is mainly caused for the following reason: the expansion of a plastic substrate or an adhesive material (organic material) due to heat or moisture absorption is much larger than that of a support substrate, such as a glass substrate made of an inorganic material, or the like; and the difference causes stress at an interface between the two substrates, resulting in the delamination. By contrast, in this embodiment, there is a strong adhesive force at an interface between the glass substrate 44 made of an inorganic material and the adhesive 45 made of an organic material which adheres thereto. The interface of the weak adhesive used for separation of the substrate in a subsequent step includes inorganic films having substantially the same thermal expansion coefficient and moisture absorbency (the SiNx film 41 and the amorphous silicon film 42). Therefore, the occurrence of stress at the interface of the two films is reduced or prevented, whereby the delamination of the substrates due to heat or a wet processing step is satisfactorily reduced or prevented.

Moreover, the high-performance TFT 16 which requires a high-temperature process at about 250° C. can be easily produced on the plastic substrate 19 by processes similar to those performed on the glass substrate without using an expensive adhesive material whose adhesive force is reduced by ultraviolet light or heat.

Moreover, in this embodiment, the SiNx film 41, which is a transparent insulating film, is used as the upper film of the weak adhesive inorganic film.

With such a configuration, the upper film of the weak adhesive inorganic film can be used as a base coat for the plastic substrate 19.

Moreover, in this embodiment, the amorphous silicon film 42 is formed as the lower film of the weak adhesive inorganic film.

With such a configuration, a release surface (an interface between the amorphous silicon film 42 and another inorganic film) having a lower adhesive force than that of the adhesive 45 can be more easily formed.

Moreover, in this embodiment, the amorphous silicon film 42 has a thickness of 200 Å or less.

With such a configuration, as shown in Table 1, the thickness of the weak adhesive inorganic film can be further reduced, resulting in a higher visibility through the back surface of the substrate. Therefore, the flexibility of the manufacturing process of liquid crystal display devices or organic EL display devices including two substrates facing each other is satisfactorily high, resulting in a satisfactory manufacture efficiency.

Moreover, in this embodiment, the ITO film 43 is stacked on the amorphous silicon film 42.

With such a configuration, the thickness of the amorphous silicon film 42 can be satisfactorily reduced to 200 Å or less while the weak adhesiveness is maintained. Moreover, the ITO film 43 is a transparent thin film. Therefore, a state of the front surface of the substrate can be observed through the back surface of the substrate, and a so-called back surface exposure, i.e., patterning by exposure with ultraviolet light through the back surface of the substrate can be performed. Therefore, various patterning processes can be performed on the plastic substrate 19 having a large substrate dimension change with high accuracy.

Moreover, in this embodiment, the amorphous silicon film 42 is stacked in an inner region of the SiNx film 41 which is located a predetermined width away from the circumferential end of the SiNx film 41.

With such a configuration, the SiNx film 41 which is the upper film of the weak adhesive inorganic film is firmly attached to the glass substrate 44 via the adhesive 45 at the circumferential end of the SiNx film 41. Therefore, when a thin film device is formed on the plastic substrate, there is a satisfactory robustness to a physical force in a horizontal direction.

Moreover, the process time can be reduced by strongly applying water, a chemical solution, or the like.

Moreover, in this embodiment, the aforementioned predetermined width as measured from the circumferential end of the SiNx film 41 is 10 mm or less. With such a configuration, a region where the plastic substrate 19 is firmly attached to the glass substrate 44 can be minimized so that a region of the plastic substrate 19 on which a thin film multilayer device is produced can be increased.

Moreover, in this embodiment, the cut surface 51 is formed along portions of the plastic substrate 19 and the SiNx film 41 corresponding to the circumferential end of the amorphous silicon film 42, or along portions farther inside than those portions, by, for example, irradiation with the laser light 50. The plastic substrate 19 and the SiNx film 41 farther inside than the cut surface 51 are separated from the amorphous silicon film 42, to separate the plastic substrate 19 from the glass substrate 44.

With such a configuration, it is no longer necessary to separate, from the glass substrate 44, a portion of the plastic substrate 19 farther outside than the cut surface 51 which is firmly attached via the adhesive 45. Therefore, the plastic substrate 19 can be more easily separated from the glass substrate 44.

Industrial Applicability

As described above, the present invention is useful for methods for manufacturing thin film multilayer devices, methods for manufacturing display devices, and thin film multilayer devices.

The invention claimed is:
1. A method for manufacturing a thin film multilayer device including a plastic substrate and a plurality of thin films stacked on the plastic substrate, comprising:

a first step of preparing a plastic substrate on which a first inorganic film and a second inorganic film are stacked in this stated order;

a second step of bonding the plastic substrate to a support substrate using an adhesive so that the first and second inorganic films are sandwiched between the plastic substrate and the support substrate, and the plastic substrate is supported by the support substrate with an adhesive force stronger than an adhesive force between the first and second inorganic films;

a third step of stacking a plurality of thin films on the plastic substrate supported by the support substrate; and a fourth step of separating the first inorganic film from the second inorganic film to separate the plastic substrate on which the plurality of thin films are stacked, from the support substrate.

2. The method of claim 1, wherein
the first inorganic film is a transparent insulating film.

3. The method of claim 1, wherein
the second inorganic film is an amorphous silicon film.

4. The method of claim 3, wherein
the amorphous silicon film has a thickness of 200 Å or less.

5. The method of claim 4, further comprising the step, between the first and second steps, of:
stacking a third inorganic film on the amorphous silicon film.

6. The method of claim 5, wherein
the third inorganic film is a transparent thin film.

7. The method of claim 1, wherein
the second inorganic film is stacked in an inner region of the first inorganic film located a predetermined width away from a circumferential end of the first inorganic film.

8. The method of claim 7, wherein
the predetermined width is 10 mm or less.

9. The method of claim 7, further comprising the step, between the third and fourth steps, of:
forming a cut surface along first portions of the plastic substrate and the first inorganic film corresponding to the circumferential end of the second inorganic film, or second portions farther inside than the first portions of the plastic substrate and the first inorganic film, wherein
in the fourth step, the plastic substrate and the first inorganic film farther inside than the cut surface is separated from the support substrate.

10. A method for manufacturing a display device including a thin film multilayer device including a plastic substrate and a plurality of thin films stacked on the plastic substrate, comprising:

a first step of preparing a plastic substrate on which a first inorganic film and a second inorganic film are stacked in this stated order;

a second step of bonding the plastic substrate to a support substrate using an adhesive so that the first and second inorganic films are sandwiched between the plastic substrate and the support substrate, and the plastic substrate is supported by the support substrate with an adhesive force stronger than an adhesive force between the first and second inorganic films;

a third step of stacking a plurality of thin films on the plastic substrate supported by the support substrate; and a fourth step of separating the first inorganic film from the second inorganic film to separate the plastic substrate on which the plurality of thin films are stacked, from the support substrate.

* * * * *